(12) United States Patent
Oklobdzija et al.

(10) Patent No.: US 6,232,810 B1
(45) Date of Patent: May 15, 2001

(54) FLIP-FLOP

(75) Inventors: Vojin G. Oklobdzija, Berkeley; Vladimir Stojanovic, Stanford, both of CA (US)

(73) Assignee: Hitachi America, Ltd., Tarrytown, NY (US)

( * ) Notice: Subject to any disclaimer, the term of this patent is extended or adjusted under 35 U.S.C. 154(b) by 0 days.

(21) Appl. No.: 09/208,618

(22) Filed: Dec. 8, 1998

(51) Int. Cl.$^7$ .................................................. H03K 3/12
(52) U.S. Cl. ............................................ 327/217; 327/218
(58) Field of Search .................... 327/218, 217, 327/208, 210, 199, 214, 215

(56) References Cited

U.S. PATENT DOCUMENTS

| | | | |
|---|---|---|---|
| 4,845,675 | 7/1989 | Krenik et al. | 365/203 |
| 4,910,713 | 3/1990 | Maden et al. | 365/189 |
| 5,124,568 | * 6/1992 | Chen et al. | 307/243 |
| 5,192,878 | 3/1993 | Miyamoto et al. | 307/362 |
| 5,793,236 | * 8/1998 | Kosco | 327/218 |

OTHER PUBLICATIONS

S.H. Unger, et al., "Clocking Schemes for High–Speed Digital Systems," (Oct. 1986) IEEE Transactions on Computers, vol. C–35, No. 10, pp. 880–895.

J. Montanaro, et al., "A 160–MHz, 32–b, 0.5–W CMOS RISC Microprocessor," (Nov. 1996) IEEE Journal of Solid–State Circuits, vol. 31, No. 11, pp. 1703–1712.

B.A. Gieseke, et al., "FA 10.7: A 600MHz Superscaler RISC Microprocessor with Out–Of–Order Execution," IEEE International Solid–State Circuits Conference, pp. 176–177.

G.J. Fisher, "An Enhanced Power Meter for SPICE2 Circuit Simulation," (May 1988) IEEE Transactions on Computer–Aided Design, vol. 7, No. 5, pp. 641–643.

D.W. Dobberpuhl, "Circuits and Technology for Digital's StrongARM™ and ALPHA Microprocessors," (1997) IEEE, pp. 2–11.

M. Matsui, et al., "A 200 MHz 13 mm$^2$ 2–D DCT Macrocell Using Sense–Amplifying Pipeline Flip–Flop Scheme," (Dec. 1994) IEEE Journal of Solid–State Circuits, vol. 29, No. 12.

T. Kobayashi, et al., "A Current–mode Latch Sense Amplifier and a Static Power Saving Input Buffer for Low–power Architecture," (1992) Symposium on VLSI Circuits Digest of Technical Papers, IEEE, pp. 28–29.

* cited by examiner

Primary Examiner—Toan Tran
Assistant Examiner—Linh Nguyen
(74) Attorney, Agent, or Firm—Flehr Hohbach Test Albritton & Herbert LLP

(57) ABSTRACT

An improved SR latch has a two stages. A generation block generates Q and $\bar{Q}$ signals from a set signal and a reset signal. The generation block also has an inactive state. A storage block receives the Q and $\bar{Q}$ signals and maintains the Q signal and $\bar{Q}$ signals at the voltage level that was output by the generation block prior to when the generation block blocks becomes inactive. In another embodiment, an improved D flip-flop has a sensing block with the improved SR latch of the present invention.

27 Claims, 7 Drawing Sheets

FLIP-FLOP

FIELD OF THE INVENTION

This present invention relates generally to digital circuits, and more particularly to high-speed data latching circuits, such as flip-flops, for temporarily storing digital information.

BACKGROUND OF THE INVENTION

Flip-flops are used in many applications and, in particular, in digital systems, such as processors, digital signal processors and memories. FIG. 1 shows a circuit diagram of a prior art D flip-flop 10. The D flip-flop 10 has a data sensing block 12 coupled to an SR latch 14. The data sensing block 12 is well-known. A substantially similar data sensing block is described in U.S. Pat. No. 4,910,713 to Madden et al.

Typically, the SR latch 14 has a pair of cross-coupled NAND gates 16, 18. One input of one NAND gate 16 has a set input $\overline{S}$ that receives a set signal, and one input of the other NAND gate 18 has a reset input $\overline{R}$ that receives a reset signal. The SR latch 14 outputs two signals, Q and $\overline{Q}$. A high voltage level, a logical one, on the set input $\overline{S}$ and a low voltage level, a logical zero, on the reset input $\overline{R}$ will reset (clear) the flip-flop 14 such that the Q output has a low voltage level and the $\overline{Q}$ output has a high voltage level. A high voltage level on the reset input $\overline{R}$ and a low voltage level on the set input $\overline{S}$ will set the SR latch 14 to a state in which the Q output has a high voltage level and the $\overline{Q}$ output has a low voltage level. The SR latch 14 operates on the assumption that a low voltage level will not appear simultaneously at both the set $\overline{S}$ and reset $\overline{R}$ inputs. If both the set $\overline{S}$ and reset $\overline{R}$ inputs have a high voltage level, the SR latch 14 will not change state, but remain in its present state. A high voltage level on the set $\overline{S}$ and reset $\overline{R}$ inputs is considered nonactivating. The SR latch 14 can also be formed with cross-coupled NOR gates.

Referring also to FIG. 2, a timing diagram of the data sensing block 12 and SR latch 14 of FIG. 1 is shown. When the clock (clk) signal is at a low voltage, the set $\overline{S}$ and reset $\overline{R}$ outputs of the data sensing block 12 are at a high voltage level. When the clock signal (clk) transitions high, the D input is at a low voltage and the $\overline{D}$ input is at a high voltage; therefore the set $\overline{S}$ signal remains at a high voltage level while the reset $\overline{R}$ signal transitions to a low voltage level as shown by arrow 21. In response to the low voltage level of the reset $\overline{R}$ signal at the NAND gate 18 input, the $\overline{Q}$ signal transitions to a high voltage level, as shown by arrow 22. In response to the high voltage level of the $\overline{S}$ and $\overline{Q}$ signals at the NAND gate 16 inputs, the $\overline{Q}$ signal transitions to a low voltage level (arrow 23).

Note that the delay of the NAND gate 18 determines the amount of time for the $\overline{Q}$ signal to transition from a low voltage level to a high voltage level (arrow 24) and the delay of the NAND gate 16 determines the amount of time for the Q signal to transition from the high voltage level to a low voltage level (arrow 25).

When the D input is at a high voltage level and the $\overline{D}$ input is at a low voltage level and the clock signal (clk) transitions high, the NAND gates 16 and 18 also determine the amount of time for the Q and $\overline{Q}$ signals to transition to a high voltage level and a low voltage level, respectively.

The inventors identified that the cross-coupled NAND gates 16, 18 of the SR latch 14 limit the speed of the D flip-flop 10. The cross-coupled NAND gates 16, 18 are a single stage which simultaneously generates and latches the Q and $\overline{Q}$ signals. When either the set or reset signal transitions from a high to a low voltage level, the set $\overline{S}$ and reset $\overline{R}$ signals must pass through two NAND gates 16, 18 to generate the Q and $\overline{Q}$ outputs. Therefore the SR latch 14 has two gate delays between a change of the voltage level on the set $\overline{S}$ or reset $\overline{R}$ inputs and the rising and falling edges at the Q and $\overline{Q}$ outputs. This degrades the speed of the circuit by more than 70%. Moreover, at the process limits, the speed further degrades and the amount of speed degradation can exceed 100%.

In FIG. 3, a similar circuit 20 to the circuit shown in FIG. 1 is used in another prior art D flip-flop. The circuit 20 of FIG. 3 is similar to the circuit 10 of FIG. 1 except that the transistor N6 (FIG. 1) is not used. Transistor N6 ensures the static operation of the data sensing block 12 of the flip-flop 10 for low-power applications. Transistor N6 does not have significant impact on the speed of the flip-flop 10. Since the SR latch 14 of FIG. 3 is the same as the SR latch 14 of FIG. 1, the D flip-flop 20 of FIG. 2 has similar performance problems to the D flip-flop of FIG. 1.

Processor speed and performance is ever-increasing. Therefore a flip-flop that operates at a higher speed is desirable.

SUMMARY OF THE INVENTION

It is an object of the present invention to provide an improved flip-flop that operates at a higher processor speed.

It is another objective of the present invention to provide an SR latch that operates at a higher speed.

These and other objectives and advantages of the present invention are generally achieved by an SR latch that separates the generation of the Q and $\overline{Q}$ signals from the latching or storage function. A generation block generates the appropriate Q and $\overline{Q}$ signals based on the set and reset input signals, then a storage block latches the Q and $\overline{Q}$ signals, thereby eliminating the two gate delays of the cross-coupled NAND gates of the prior art.

More particularly, the generation block has first and second logic blocks for generating the Q and $\overline{Q}$ signals, respectively, from set and reset signals. The first and second logic blocks also have an inactive state. A static storage block receives the Q and $\overline{Q}$ signals and maintains the Q signal and $\overline{Q}$ signals at the voltage level that was output prior to when the first and second logic blocks become inactive.

In another embodiment, a D flip-flop has a sensing block coupled to the SR latch of the present invention.

A method of operating an SR latch is also provided in which set and reset signals are received. Q and $\overline{Q}$ signals are generated from the set and reset signals. The Q and $\overline{Q}$ signals have complementary states. After the Q and $\overline{Q}$ signals are generated, the complementary states of the Q and $\overline{Q}$ signals are latched.

Other features and advantages of the present invention will become apparent to a person skilled in the art who studies the present invention disclosure. Therefore, a more detailed description of a preferred embodiment of the invention is given with respect to the following drawings.

DETAILED DESCRIPTION OF THE PREFERRED EMBODIMENTS

Figure 4:
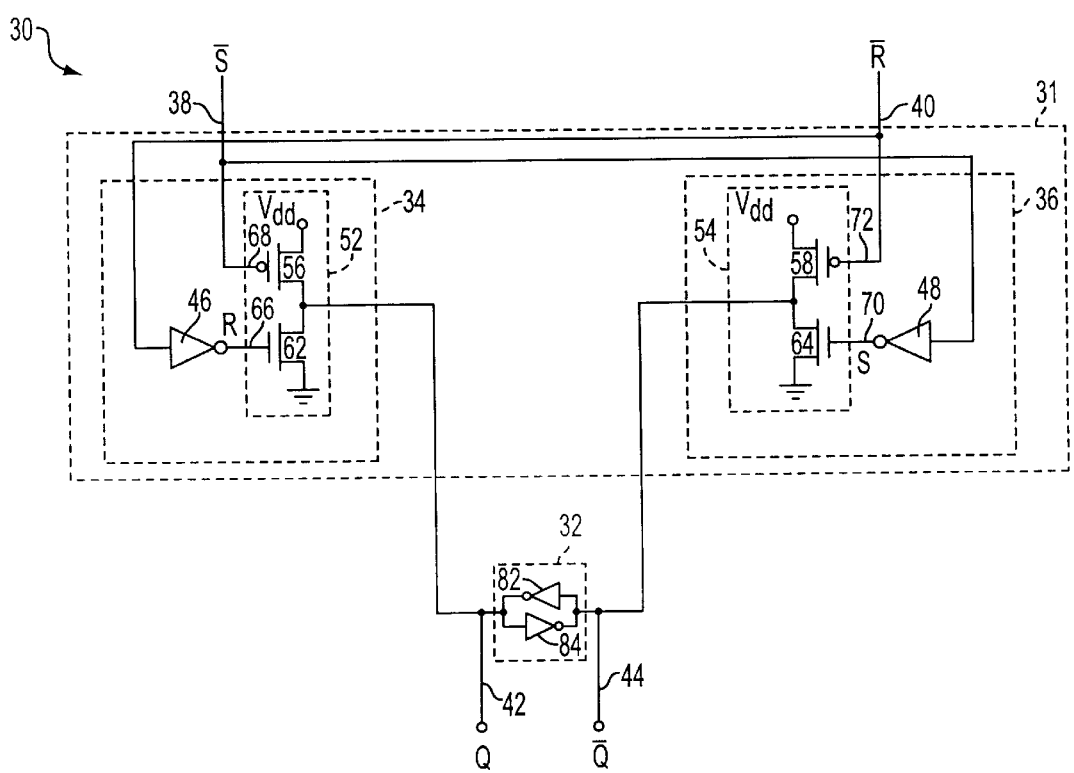
FIG. 4 is a circuit diagram of an SR latch of the present invention.

In FIG. 4, the SR latch 30 separates the generation of the Q and $\overline{Q}$ signals from the latching or storage function. A generation block 31 has first and second logic blocks, 34 and 36, respectively, that generate the Q and $\overline{Q}$ signals from the set and reset signals. A storage block 32 stores the Q and $\overline{Q}$ signals generated by the generation block 31. By separately generating the Q and $\overline{Q}$ signals prior to latching, the speed of the SR latch is increased.

The static storage block 32 is coupled between the first and second logic blocks, 34 and 36, respectively. The first logic block 34 receives a set signal $\overline{S}$ 38 and a reset signal $\overline{R}$ 40, and outputs a Q signal 42. When the set signal $\overline{S}$ 38 has a low voltage level and the reset signal $\overline{R}$ 40 has a high voltage level, the Q signal 42 generates a high voltage level. When the set signal $\overline{S}$ 38 has a high voltage level and the reset signal $\overline{R}$ 40 has a low voltage level, Q signal 42 generates a low voltage level. The first logic block 34 becomes inactive when the set signal $\overline{S}$ 38 has a high voltage level and the reset signal $\overline{R}$ 40 has a high voltage level. The term inactive means that the logic block 34 output has a high impedance state.

The second logic block 36 also receives the set signal $\overline{S}$ 38 and the reset signal $\overline{R}$ 40, and outputs a $\overline{Q}$ signal 44. The $\overline{Q}$ signal 44 transitions to a high voltage level when the set signal $\overline{S}$ 38 has a high voltage level and the reset signal $\overline{R}$ 40 has a low voltage level. The $\overline{Q}$ signal 44 transitions to a low voltage level when the set signal $\overline{S}$ 38 has a low voltage level and the reset signal $\overline{R}$ 40 has a high voltage level. The $\overline{Q}$ signal 44 becomes inactive when the set signal $\overline{S}$ 38 has a high voltage level and the reset signal $\overline{R}$ 40 has a high voltage level.

The static storage block 32 is coupled between the first and second logic blocks 34, 36, respectively. The static storage block 32 is responsive to the high and low voltages output by the first and second logic blocks. The static storage block 32 maintains the Q signal 42 and the $\overline{Q}$ signal 44 at the voltage level that was output prior to when the first and second logic blocks 34, 36 became inactive.

In particular, the first and second logic blocks 34, 36 have a similar structure. An inverter 46, 48 is coupled to a stacked transistor pair 52, 54 that acts like combinational logic, such as a NOR gate. The stacked transistor pairs 52, 54 have a pMOS transistor 56, 58 connected in series with an NMOS transistor 62, 64, respectively. However, the stacked transistor pairs 52, 54 of the present invention differ from typical combinational logic. When all the gates of the pMOS and NMOS transistors 66, 68, 70 and 72, are at a high voltage level, the stacked transistor pairs 52, 54 do not output a high voltage, but become inactive and go into a high impedance state such that no signal is output.

The static storage block 32 has a pair of cross-coupled inverters 82, 84 that latch the Q signal 42 and the $\overline{Q}$ signal 44 from the first logic block 34 and second logic block 36, respectively, prior to the time at which the first logic block 34 and the second logic block 36 became inactive.

Figure 5:
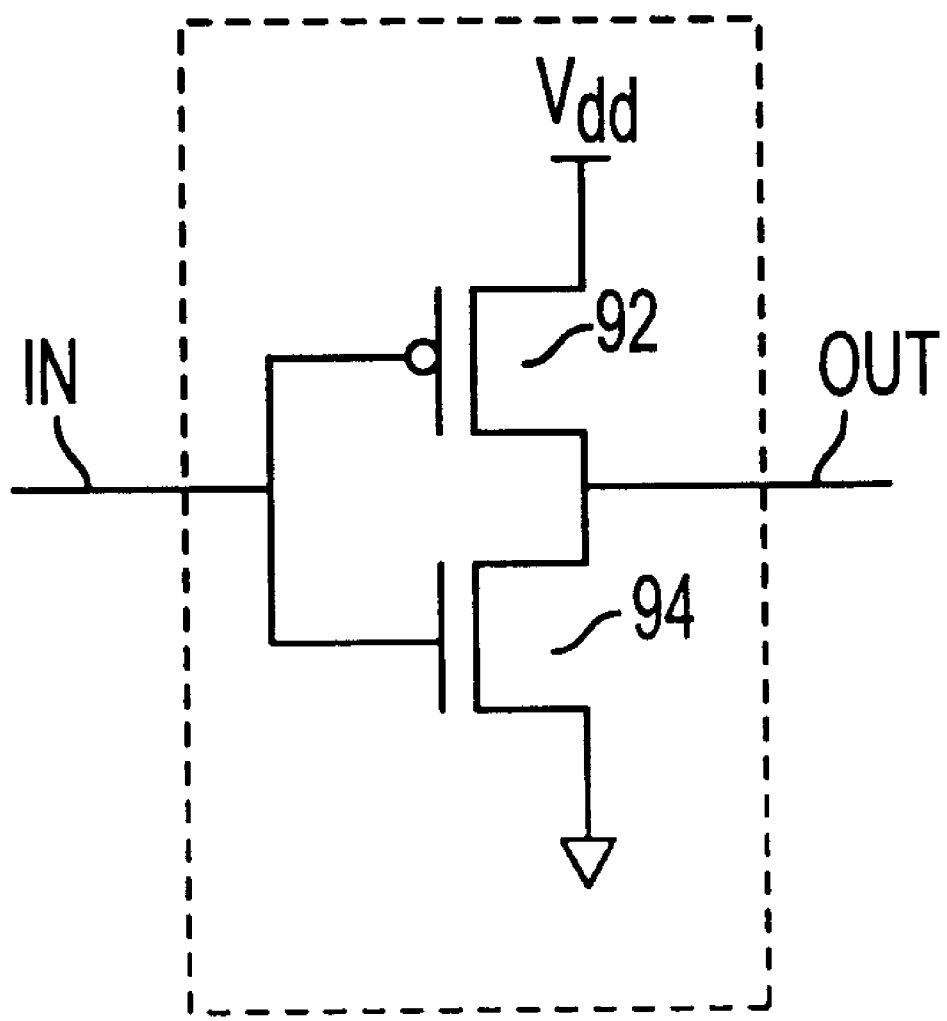
FIG. 5 is a circuit diagram of one embodiment of an inverter suitable for use in the present invention.

FIG. 5 is a schematic of an inverter 92 suitable for use with the present invention having a pMOS transistor 94 and an nMOS transistor 96 with input IN and output OUT.

Figure 6A:
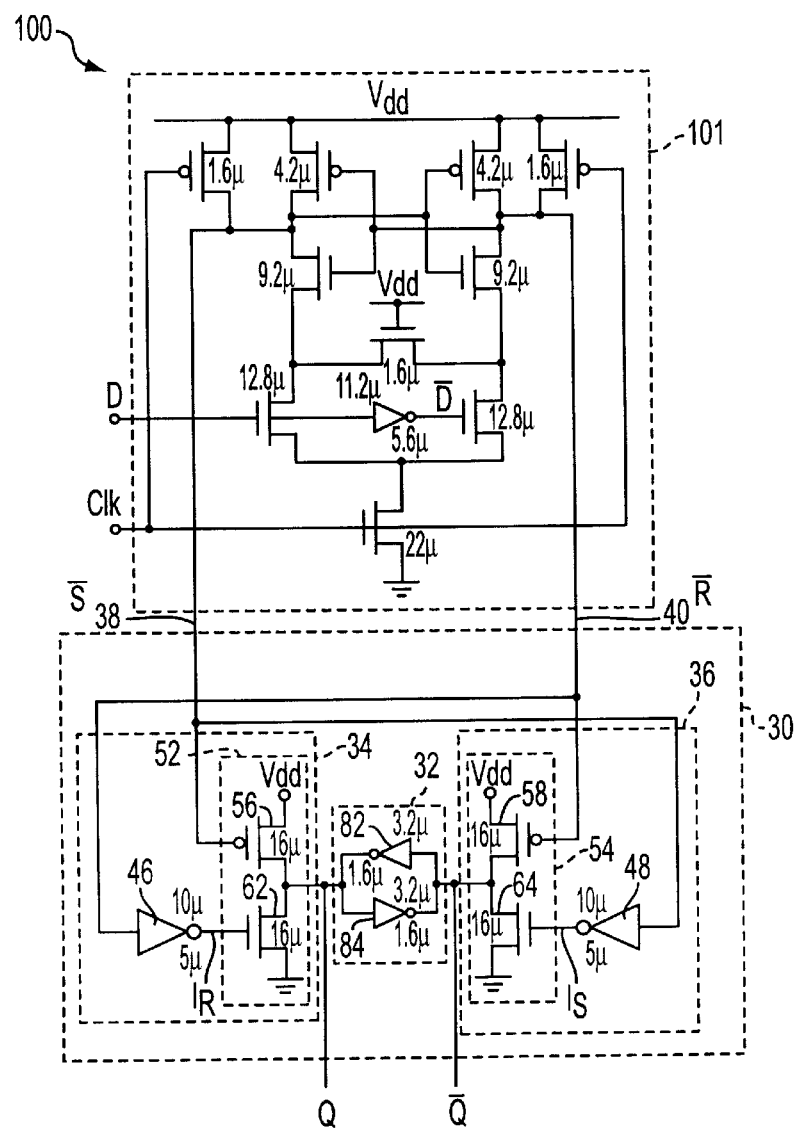
FIG. 6A is a circuit diagram of a D flip-flop using the SR latch of the present invention that shows the size of the transistors.

In FIG. 6A, an improved D flip-flop 100 has a sensing block 101 coupled to the SR latch 30 of the present invention. The sensing block 101 is well-known. U.S. Pat. No. 4,910,713, to William C. Madden et al., titled "High Input Impedance, Strobed CMOS Differential Sense Amplifier", granted Mar. 20, 1990 is incorporated herein by reference as background information on the sensing block 101. The sensing block 101 generates the set $\overline{S}$ and reset $\overline{R}$ signals, 38 and 40, respectively, which are input to the SR latch 30.

Figure 6B:
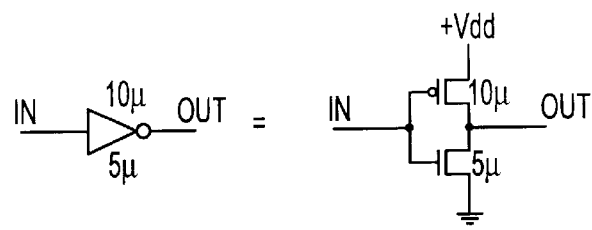
FIG. 6B is a circuit diagram of an inverter of FIG. 6A showing the size of the transistors.

FIG. 6A also shows the widths of the transistors in microns ($\mu$) in one embodiment that uses 0.2 $\mu$ cmos technology. The length and the effective length of all the transistors, including the transistors of the inverters, is the same and is equal to 0.2 $\mu$. In FIG. 6A, the number above the inverter is the width of the pMOS transistor, and the number below the inverter is the width of the nMOS transistor. For example, as shown in FIG. 6B, the inverter 46 of the first logic block has a pMOS transistor with a width of 10 $\mu$ and an nMOS transistor with a width of 5 $\mu$.

The transistors of the inverters 46, 48 of the first and second logic blocks, 34, 36, respectively, are larger than the transistors of the inverters 82, 84 of the static storage block 32. The transistors of the inverters 46, 48 are sized such that the flip-flop operates at a predetermined speed. In particular, the transistors of the inverter 46 are sized such that the amount of delay through pMOS transistor 58 is substantially equal to the amount of delay through inverter 46 and nMOS transistor 62. The transistors of the inverter 48 are sized such that the amount of delay through pMOS transistor 56 is substantially equal to the amount of delay through inverter 48 and NMOS transistor 64. Therefore, transitions of the Q and $\overline{Q}$ signals have substantially the same amount of delay.

Since the static storage block 32 latches the Q and $\overline{Q}$ signals after the Q and $\overline{Q}$ signals are generated and output by the first and second logic blocks 34, 36, respectively, the transistors of the inverters 82, 84 of the static storage block 32 are not required to operate at the same high speed as the transistors of the inverters 46, 48. Therefore, the transistors of the inverters 82, 84 of the static storage block are smaller than the transistors of the inverters 46, 48 of the first and second logic blocks 34, 36.

In addition, in the first logic block 34, the pMOS transistor 56 is substantially the same size as the nMOS transistor 62 to compensate for the delay from the inverter 46. Therefore, both rising and falling edge transitions of the Q signal 42 have substantially the same amount of delay. Similarly, in the second logic block 36, the pMOS transistor 58 is substantially the same size as the nMOS transistor 64 to compensate for the delay from the inverter 48.

Figure 7:
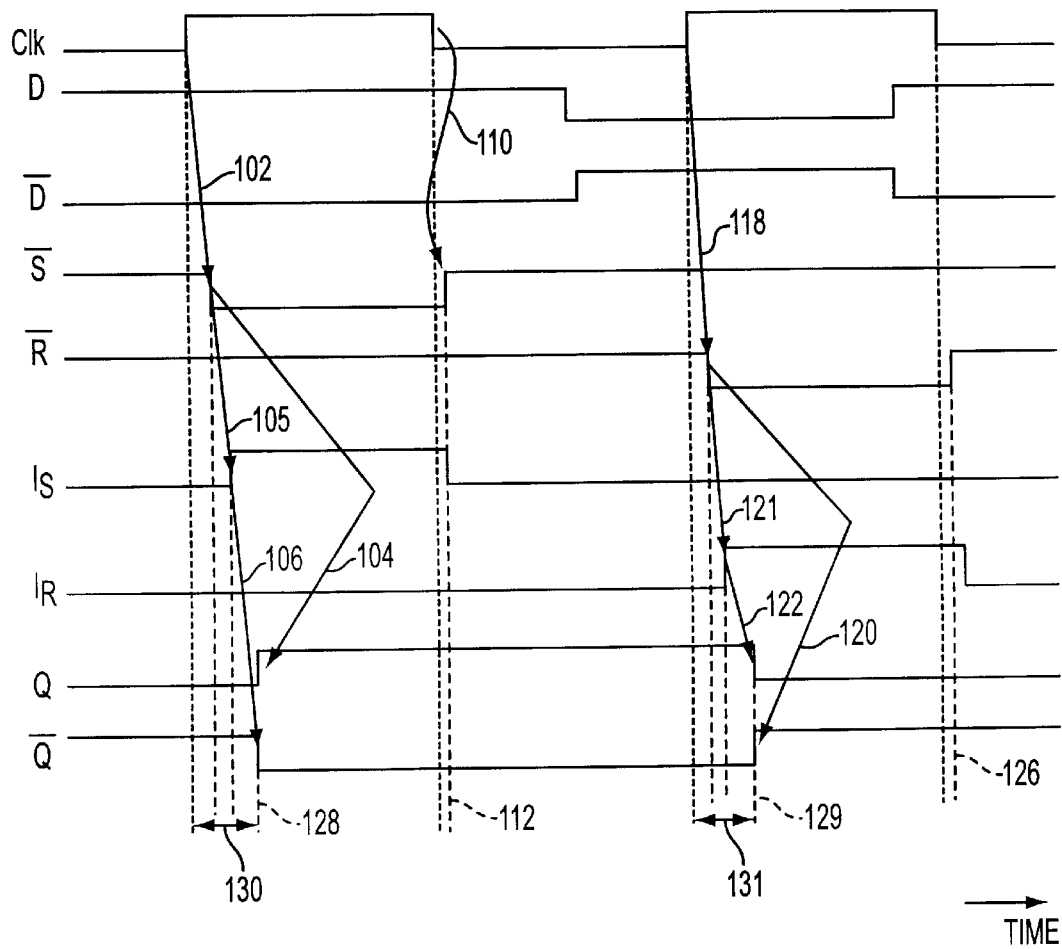
FIG. 7 is a timing diagram of the SR latch of the present invention used in connection with a data sensing block.

Referring to FIGS. 6A and 7, the timing of the SR latch 30 with respect to the clock signal (clk) from the data sensing block 101 will be described. When the clock signal (clk) is low, the data sensing block 101 outputs set $\overline{S}$ and reset $\overline{R}$ signals that have a high voltage level. In this example, when the clock signal (clk) transitions to a high voltage level, the set signal $\overline{S}$ transitions to a low voltage level, as indicated by arrow 102. When the set signal $\overline{S}$ transitions to a low voltage level, the Q output signal transitions to a high voltage level, as indicated by arrow 104, and the output signal Is of inverter 48 transitions to a high voltage level, as indicated by arrow 105. When the Is signal output by inverter 48 transitions high, nMOS transistor 64 turns on and the $\overline{Q}$ output signal transitions to a low voltage level, as indicated by arrow 106.

After the Q and $\overline{Q}$ signals have reached their complementary high and low voltage levels, the static storage block 32 latches the Q and $\overline{Q}$ signal s. In particular, when the clock signal returns to a low voltage level as shown by arrow 110, the set $\overline{S}$ signal transitions to a high voltage level which causes the first and second logic blocks, 34 and 36, respectively, to not generate a signal, but present a high impedance state at their output. Before the first and second logic blocks, 34 and 36 respectively, generate the high impedance state (as shown by line 112) but after the Q and $\overline{Q}$ output signals reach their complementary states, the static storage block 32 latches the Q and $\overline{Q}$ output signals.

Similarly, when the reset signal $\overline{R}$ transitions to a low voltage level, as shown by arrow 118, the $\overline{Q}$ output transitions to a high voltage level as indicated by arrow 120 and the $I_R$ signal output by inverter 46 transitions to a high voltage level, as shown by arrow 121. When the $I_R$ signal output by inverter 46 transitions high, NMOS transistor 62 turns on and the Q output transitions to a low voltage level, as indicated by arrow 122. In addition, before the first and second logic blocks, 34 and 36, respectively, generate the high impedance state when $\overline{R}$ transitions to a high voltage level (as shown by line 126) but after the Q and $\overline{Q}$ outputs reach their complementary states, the static storage block 32 latches the Q and $\overline{Q}$ outputs.

A particularly noteworthy aspect of the present invention is that the Q and $\overline{Q}$ signals reach their complementary states at substantially the same time, as shown by lines 128 and 129. In other words, the amount of delay from the positive edge transition of the clock signal (clk) to the time when the Q and $\overline{Q}$ signals reach their complementary states is substantially equalized, as shown by arrows 130 and 131.

Figure 1:
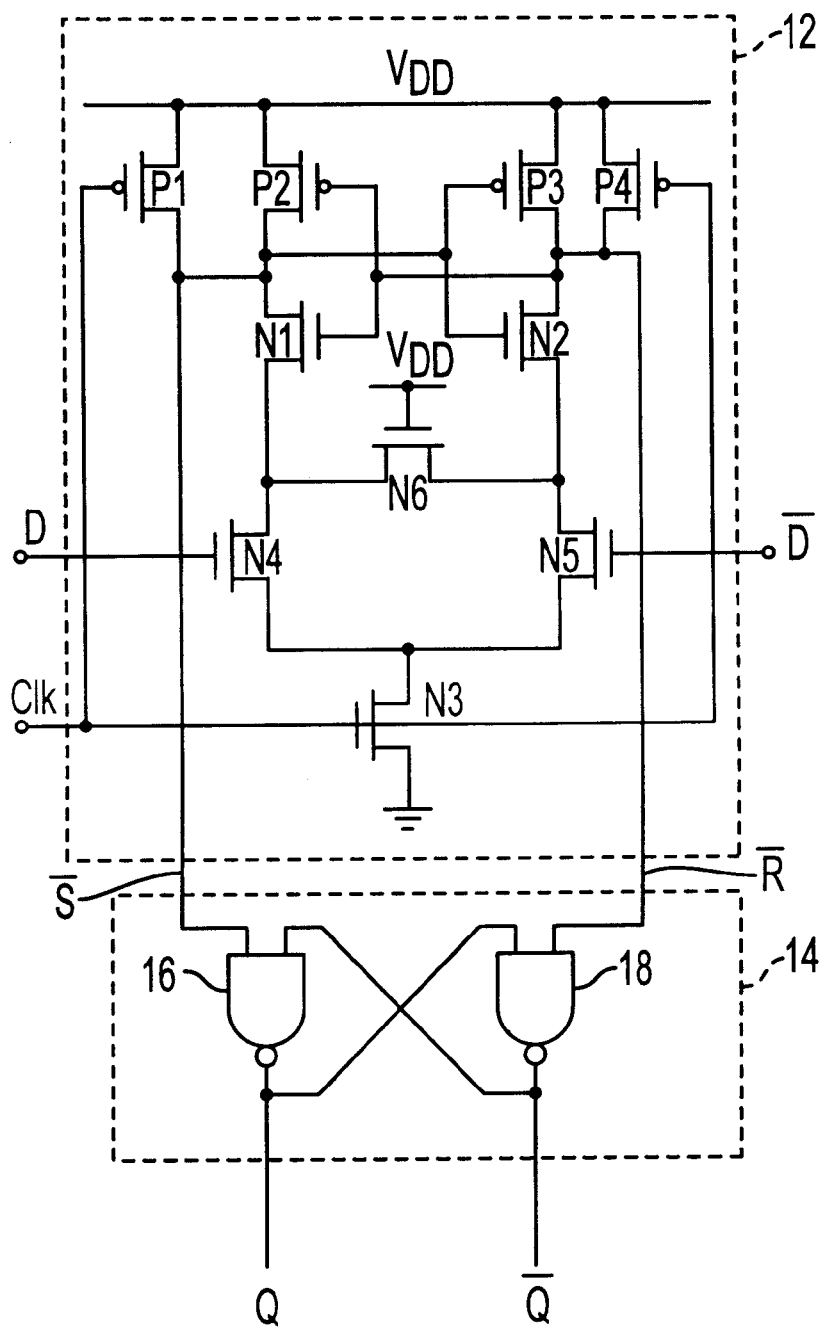
FIG. 1 is a circuit diagram of one prior art D flip-flop.

Simulation comparisons of the SR flip-flop of the present invention with the prior art D flip-flop of FIG. 1 were performed using the transistor channel lengths and widths as described above with respect to FIGS. 6A and 6B. In the simulation, the channel length was 0.2 $\mu$, the minimum gate width was 1.6 $\mu$ and the maximum gate width was 22 $\mu$. The threshold voltage was 0.7 volts and the capacitive load (Cl) was 200 fF which is equivalent to the fan-out of twenty-two minimum size inverters (3.2 $\mu$/1.6 $\mu$). The power supply voltage Vdd was 2 volts and the temperature was 25° C. The results are shown in Tables 1, 2, 3 and 4 below.

TABLE 1

Flip-Flop of FIG. 1, General Characteristics

| Design | Delay (ps) | Internal Power ($\mu$W) | Clock Power ($\mu$W) | Data Power ($\mu$W) | Total Power ($\mu$W) | Total PDP (fJ) | Number of Transistors |
|---|---|---|---|---|---|---|---|
| Invention | 171 | 148 | 18 | 3 | 169 | 28.899 | 22 |
| Prior Art | 275 | 141 | 18 | 3 | 162 | 44.550 | 18 |

TABLE 2

Flip-Flop of FIG. 1, Timing Parameters

| Design | Clk-Q($\overline{Q}$)hl (ps) | Clk-Q($\overline{Q}$)lh (ps) | Minimum D-Q($\overline{Q}$)hl (ps) | Minimum D-Q($\overline{Q}$)lh (ps) | Optimum Set up time (ps) | Minimum Set up time (ps) |
|---|---|---|---|---|---|---|
| Invention | 155 | 163 | 163 | 171 | −35 | −70 |
| Prior Art | 262 | 162 | 275 | 171 | −35 | −70 |

TABLE 3

Figure 2:
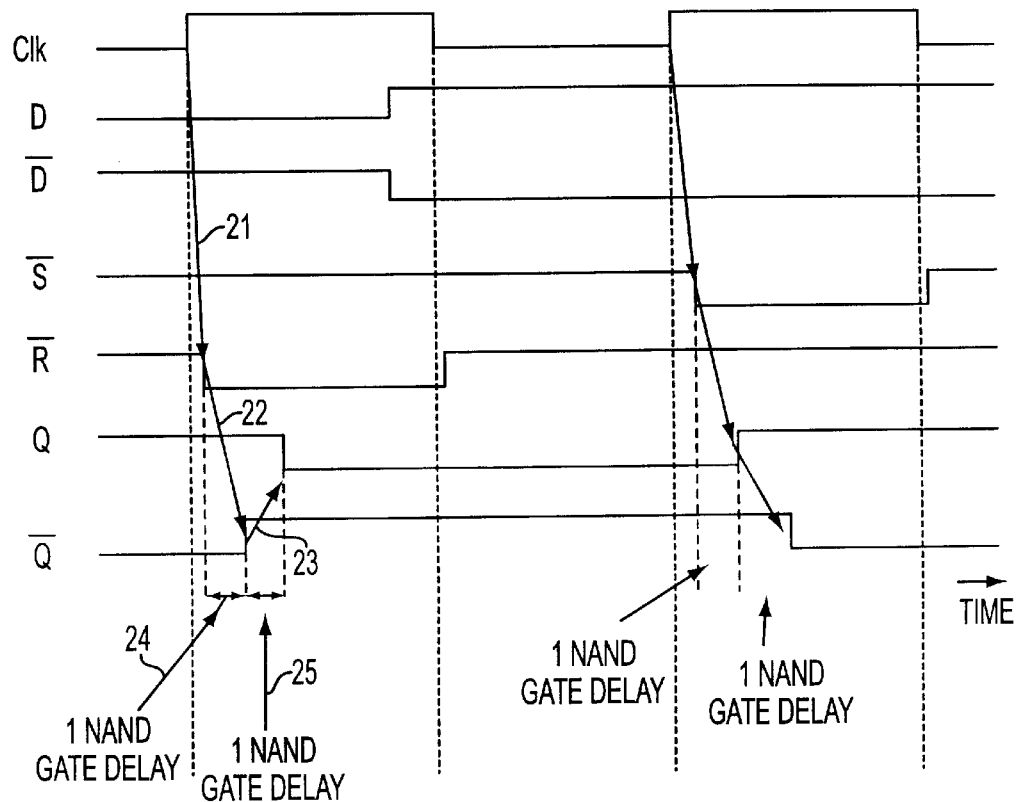
FIG. 2 is a timing diagram of the prior art D flip-flop of FIG. 1.
Figure 3:
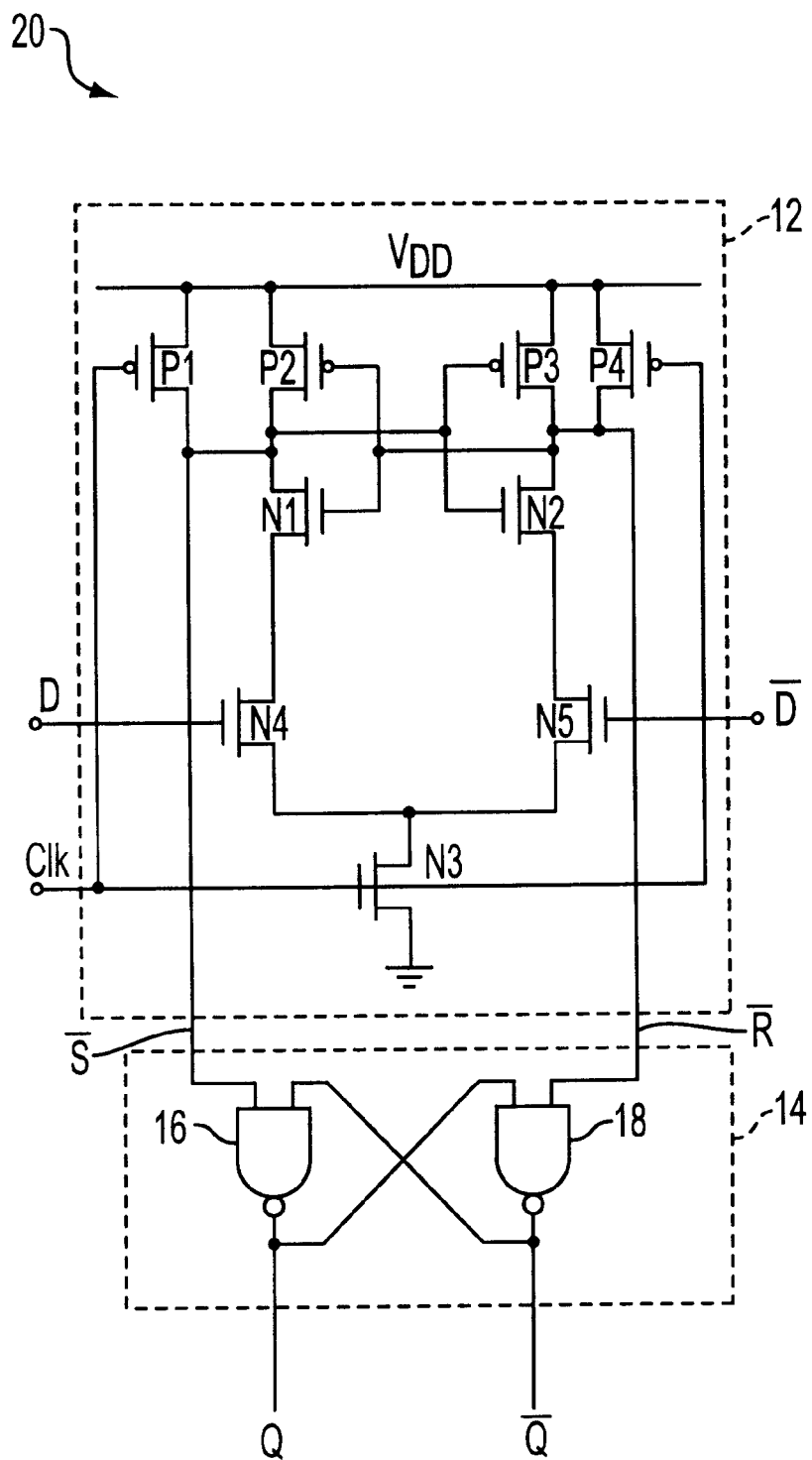
FIG. 3 is a circuit diagram of another prior art D flip-flop.

Flip-Flop of FIG. 2, General Characteristics

| Design | Delay (ps) | Internal Power ($\mu$W) | Clock Power ($\mu$W) | Data Power ($\mu$W) | Total Power ($\mu$W) | Total PDP (fJ) | Number of Transistors |
|---|---|---|---|---|---|---|---|
| Invention | 168 | 148 | 18 | 3 | 169 | 28.392 | 21 |
| Prior Art | 272 | 137 | 18 | 3 | 158 | 42.976 | 17 |

TABLE 4

Flip-Flop of FIG. 2, Timing Parameters

| Design | Clk-Q($\overline{Q}$)hl (ps) | Clk-Q($\overline{Q}$)lh (ps) | Minimum D-Q($\overline{Q}$)hl (ps) | Minimum D-Q($\overline{Q}$)lh (ps) | Optimum Set up time (ps) | Minimum Set up time (ps) |
|---|---|---|---|---|---|---|
| Invention | 163 | 173 | 161 | 168 | −35 | −70 |
| Prior Art | 264 | 163 | 272 | 168 | −35 | −70 |

In Tables 2 and 4, Clk-Q($\overline{Q}$)hl is the amount of time for a signal to transition from a high voltage level to a low voltage level at the Q (or $\overline{Q}$) output after the clock signal transitions to a high voltage level. Clk-Q($\overline{Q}$)lh is the amount of time for a signal to transition from a low voltage level to a high voltage level at the Q (or $\overline{Q}$) output after the clock signal transitions to a high voltage level. The minimum D-Q($\overline{Q}$)hl is the minimum amount of time for a high to low transition of the signal on the D input to appear at the Q ($\overline{Q}$) outputs of the SR latch. The minimum D-Q($\overline{Q}$)lh is the minimum amount of time for a low to high transition of the signal on the D input to appear at the Q ($\overline{Q}$) outputs of the SR latch.

In summary, the invention reduces the delay to about 62% of the original delay.

A tradeoff between speed and power is always possible. However, in high-performance, low-power applications both speed and power are equally important. The total Power Delay Product (PDP) is a combined parameter that measures the combination of speed and power and is equal to the product of the delay times the total power. The SR latch of the present invention has an improved total PDP. For the flip-flop of FIG. 1, the total PDP is reduced to about 65% of its original value, while for the flip-flop of FIG. 2, the total PDP is reduced to about 66% of its original value.

Therefore, an improved flip-flop has been provided with reduced power and that operates at a higher speed.

Other features and advantages of the present invention will become apparent to a person of skill in the art who studies the present invention disclosure. Therefore, the scope of this invention is to be limited only by the following claims.

What is claimed is:

1. An SR latch comprising:
    a generation block for independently generating Q and $\overline{Q}$ signals, respectively, from a set signal and a reset signal, the generation block also having an inactive state; and
    a storage block for receiving the Q and $\overline{Q}$ signals and maintaining the Q signal and $\overline{Q}$ signal at a voltage level that was output by the generation block prior to when the generation block becomes inactive.

2. The SR latch as claimed in claim 1 wherein the Q and $\overline{Q}$ signals are generated at substantially the same time.

3. The SR latch as claimed in claim 1 wherein the generation block includes first and second logic blocks for generating the Q and $\overline{Q}$ signals, respectively, from the set signal and the reset signal, the first and second logic blocks also having an inactive state.

4. The SR latch as claimed in claim 1 wherein the storage block is a static storage block.

5. The SR latch as claimed in claim 4 wherein the static storage block includes a pair of cross-coupled inverters.

6. The SR latch as claimed in claim 4 wherein the static storage block maintains a currently stored state when the first and the second logic blocks become inactive.

7. The SR latch as claimed in claim 4 wherein the static storage block latches the Q and $\overline{Q}$ signals before the first and the second logic blocks become inactive.

8. An SR latch comprising:
    a generation block for generating Q and $\overline{Q}$ signals, respectively from a set signal and a reset signal, the generation block also having an inactive state; and
    a storage block for receiving the Q and $\overline{Q}$ signals and maintaining the Q signal and $\overline{Q}$ signals at the voltage level that was output by the generation block prior to when the generation block becomes inactive;
    the generation block includes first and second logic blocks for generating the Q and $\overline{Q}$ signals, respectively, from the set signal and the reset signal, the first and second logic blocks also having an inactive state;
    the first logic block includes
        a first inverter for receiving the reset signal, and
        a first stacked transistor pair for receiving the set signal and the output of the first inverter, the first stacked transistor pair generating the Q signal; and
    the second logic block includes:
        a second inverter for receiving the set signal, and
        a second stacked transistor pair for receiving the reset signal and the output of the second inverter, the second stacked transistor pair generating the $\overline{Q}$ signal.

9. The SR latch as claimed in claim 8 wherein the first and the second stacked transistor pairs have an inactive state.

10. The SR latch as claimed in claim 8 wherein when one of either the first or the second stacked transistor pairs outputs a low voltage level, the other stacked transistor pair outputs a high voltage level.

11. The SR latch as claimed in claim 8 wherein the first and second stacked transistor pairs comprise a pMOS transistor connected with an nMOS transistor.

12. The SR latch as claimed in claim 11 wherein the pMOS transistor is substantially the same size as the nMOS transistor.

13. A flip-flop, comprising:
    a sensing block for receiving an input signal having either a first or a second voltage level, receiving a clock signal that transitions between first and second voltage levels, and for storing the voltage level of the input signal when the clock signal transitions between the first and the second voltage levels, the sensing block generating a set signal and a reset signal, the set signal and the reset signal having first and second voltage levels;
    a generation block for independently generating Q and $\overline{Q}$ signals at substantially the same time, respectively, from the set signal and the reset signal, the generation block also having an inactive state; and
    a storage block for receiving the Q and $\overline{Q}$ signals and maintaining the Q signal and $\overline{Q}$ signals at the voltage level that was output by the first and second logic blocks prior to when the generation block becomes inactive.

14. The flip-flop as claimed in claim 13 wherein the generation block includes first and second logic blocks for generating the Q and $\overline{Q}$ signals, respectively, from the set signal and the reset signal, the first and second logic blocks also having an inactive state.

15. The flip-flop as claimed in claim 14 wherein the storage block is a static storage block.

16. The flip-flop as claimed in claim 15 wherein the static storage block includes a pair of cross-coupled inverters.

17. The SR latch as claimed in claim 15 wherein the static storage block latches the Q and $\overline{Q}$ signals before the first and the second logic blocks become inactive.

18. A flip-flop, comprising:
    a sensing block for receiving an input signal having either a first or a second voltage level, receiving a clock signal that transitions between first and second voltage levels, and for storing the voltage level of the input signal when the clock signal transitions between the first and the second voltage levels, the sensing block generating a set signal and a reset signal, the set signal and the reset signal having first and second voltage levels;
    a generation block for generating Q and $\overline{Q}$ signals, respectively, from the set signal and the reset signal, the generation block also having an inactive state; and
    a storage block for receiving the Q and $\overline{Q}$ signals and maintaining the Q signal and $\overline{Q}$ signals at the voltage level that was output by the first and second logic blocks prior to when the generation block becomes inactive;
    the generation block includes first and second logic blocks for generating the Q and $\overline{Q}$ signals, respectively, from the set signal and the reset signal, the first and second logic blocks also having an inactive state;
    the storage block is a static storage block;
    the first logic block includes:
        a first inverter for receiving the reset signal, and
        a first stacked transistor pair for receiving the set signal and the output of the inverter, the stacked transistor pair generating the Q signal; and
    the second logic block includes:
        a second inverter for receiving the set signal, and
        a second stacked transistor pair receiving the reset signal and the output of the inverter, the stacked transistor pair generating the $\overline{Q}$ signal.

19. The flip-flop as claimed in claim 18 wherein when one of either the first or the second stacked transistor pairs outputs a low voltage level, the other stacked transistor pair outputs a high voltage level.

20. The flip-flop as claimed in claim 18 wherein the first and second stacked transistor pairs comprise a pMOS transistor connected in series with an NMOS transistor, and the pMOS transistor is substantially the same size as the NMOS transistor.

21. A method of operating an SR latch comprising the steps of: receiving set and reset signals;

independently generating Q and $\overline{Q}$ signals from the set and reset signals, the Q and $\overline{Q}$ signals having complementary states;

after said step of generating, latching the complementary states of the Q and $\overline{Q}$ signals.

22. The method as claimed in claim 21 further comprising the step of:

generating a high impedance state when the set and the reset signals are at a high voltage level, and wherein said step of latching latches the complementary Q and $\overline{Q}$ signal before said step of generating a high impedance state.

23. The method as claimed in claim 21 wherein the step of generating Q and $\overline{Q}$ including generating Q and $\overline{Q}$ at substantially the same time.

24. An SR latch comprising:

a generation block for independently generating Q and $\overline{Q}$ signals, respectively, from a set signal and a reset signal, the generation block also having an inactive state; and a storage block for receiving the Q and $\overline{Q}$ signals and maintaining the Q signal and $\overline{Q}$ signals at the voltage level that was output by the generation block prior to when the generation block becomes inactive.

25. The SR latch as claimed in claim 24 wherein the Q and $\overline{Q}$ signals transition to complementary states at substantially the same time.

26. The SR latch as claimed in claim 25 wherein:

both Q and $\overline{Q}$ have a high level and a low level; and both Q and $\overline{Q}$ transition from the high level to the low level and from the low level to the high level wherein the transition time from the high level to the low level is substantially equal to the transition time from the low level to the high level.

27. The SR latch as claimed in claim 25 wherein the generation block includes first and second logic blocks for generating the Q and $\overline{Q}$ signals, respectively, from the set signal and the reset signal;

the first logic block being capable of transitioning the Q signal from a low level to a high level and from the high level to the low level; and the second logic block being capable of transitioning the $\overline{Q}$ signal from the high level to the low level and from the low level to the high level.

\* \* \* \* \*